(12) United States Patent
Lee et al.

(10) Patent No.: US 12,520,435 B2
(45) Date of Patent: Jan. 6, 2026

(54) METHOD FOR MANUFACTURING PRINTED CIRCUIT BOARD

(71) Applicants: LX SEMICON CO., LTD., Daejeon (KR); FJ COMPOSITE MATERIALS CO., LTD., Hokkaido (JP)

(72) Inventors: Jun Ho Lee, Daejeon (KR); Nam Tae Cho, Daejeon (KR); Eiki Tsushima, Hokkaido (JP)

(73) Assignees: LX SEMICON CO., LTD., Daejeon (KR); FJ COMPOSITE MATERIALS CO., LTD., Hokkaido (JP)

( * ) Notice: Subject to any disclaimer, the term of this patent is extended or adjusted under 35 U.S.C. 154(b) by 348 days.

(21) Appl. No.: 18/262,334

(22) PCT Filed: Jan. 21, 2022

(86) PCT No.: PCT/KR2022/001097
§ 371 (c)(1),
(2) Date: Jul. 20, 2023

(87) PCT Pub. No.: WO2022/158894
PCT Pub. Date: Jul. 28, 2022

(65) Prior Publication Data
US 2024/0090139 A1 Mar. 14, 2024

(30) Foreign Application Priority Data
Jan. 21, 2021 (KR) .................. 10-2021-0008707

(51) Int. Cl.
*H05K 3/38* (2006.01)
*C23C 14/18* (2006.01)
(Continued)

(52) U.S. Cl.
CPC .......... *H05K 3/381* (2013.01); *C23C 14/185* (2013.01); *C23C 14/34* (2013.01); *H05K 1/0306* (2013.01); *H05K 3/022* (2013.01); *H05K 3/06* (2013.01); *H05K 3/388* (2013.01)

(58) Field of Classification Search
CPC ...... H05K 3/381; H05K 1/0306; H05K 3/022; H05K 3/06; H05K 3/388; C23C 14/185; C23C 14/34
See application file for complete search history.

(56) References Cited

U.S. PATENT DOCUMENTS

| 9,439,279 B2 | 9/2016 | Tani et al. |
| 2006/0183298 A1 | 8/2006 | Schulz-Harder et al. |

(Continued)

FOREIGN PATENT DOCUMENTS

| JP | 2005-213107 A | 8/2005 |
| JP | 2006-527666 A | 12/2006 |

(Continued)

OTHER PUBLICATIONS

KR 20160126926, English machine translation, "Ceramic Board Manufacturing Method and Ceramic Board manufactured by thereof" (Year: 2016).*

(Continued)

*Primary Examiner* — Anita K Alanko
(74) *Attorney, Agent, or Firm* — ROTHWELL, FIGG, ERNST & MANBECK, P.C.

(57) ABSTRACT

This application relates to a method for manufacturing a printed circuit board. According to the present application, it is possible to manufacture a printed circuit board having excellent bonding strength between a ceramic substrate and a metal sheet, and the manufacturing cost thereof can be reduced.

15 Claims, 4 Drawing Sheets

(51) Int. Cl.
*C23C 14/34* (2006.01)
*H05K 1/03* (2006.01)
*H05K 3/02* (2006.01)
*H05K 3/06* (2006.01)

(56) References Cited

U.S. PATENT DOCUMENTS

2009/0130607 A1   5/2009   Slafer
2014/0126155 A1   5/2014   Imamura et al.
2018/0090414 A1   3/2018   Dan et al.
2025/0063671 A1*  2/2025   Cho .................... H05K 1/0306

FOREIGN PATENT DOCUMENTS

| JP | 2014-204031 A | 10/2014 | |
| JP | 2018-137396 A | 8/2018 | |
| KR | 10-2016-0126926 A | 11/2016 | |
| KR | 10-2017-0048999 A | 5/2017 | |
| KR | 10-2018-0084529 A | 7/2018 | |
| KR | 20210144343 A * | 11/2021 | ............ H05K 3/381 |

OTHER PUBLICATIONS

KR 2021-0144343 A, English machine translation, "Method for Preparing Printed Circuit Board" (Year: 2021).*
International Search Report issued for International Application No. PCT/KR2022/001097 on Apr. 26, 2022, 6 pages.
Extended European Search Report issued for European Application No. 22742870.3 on Dec. 20, 2024, 7 pages.

* cited by examiner

[FIG. 1]
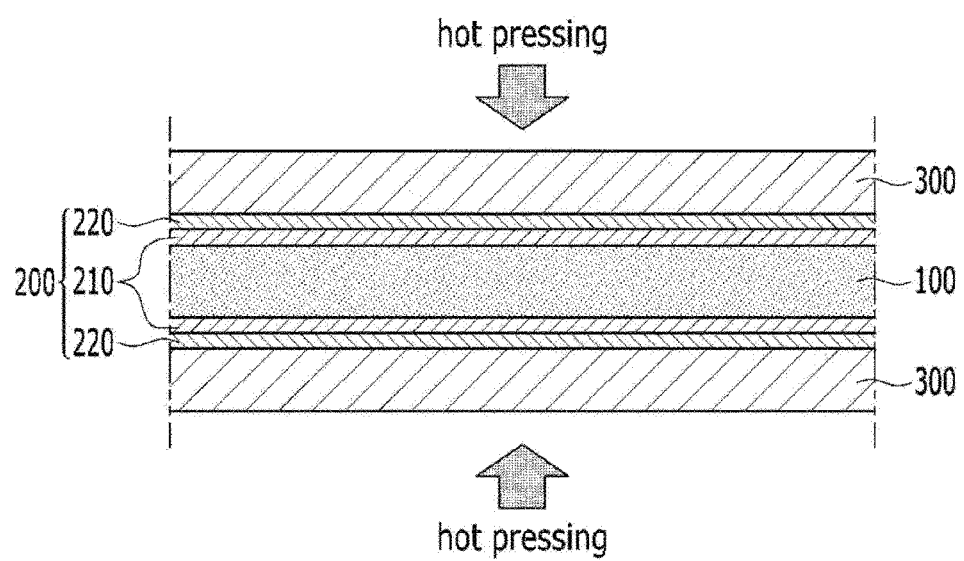

[FIG. 2]

| Arrangement and schematic diagram of bonding | Related art | Embodiment of the present application |
| --- | --- | --- |
| | | After arranging two ceramic substrates side by side on a plane, bonding |
| Yield/batch | N pieces | 2N pieces |
| Etching cost per MC | X won | About X (1-0.2) Won |

[FIG. 3]
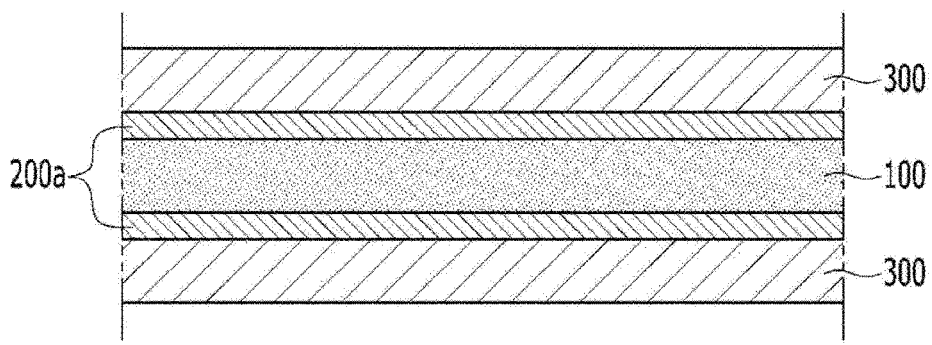
[FIG. 4]
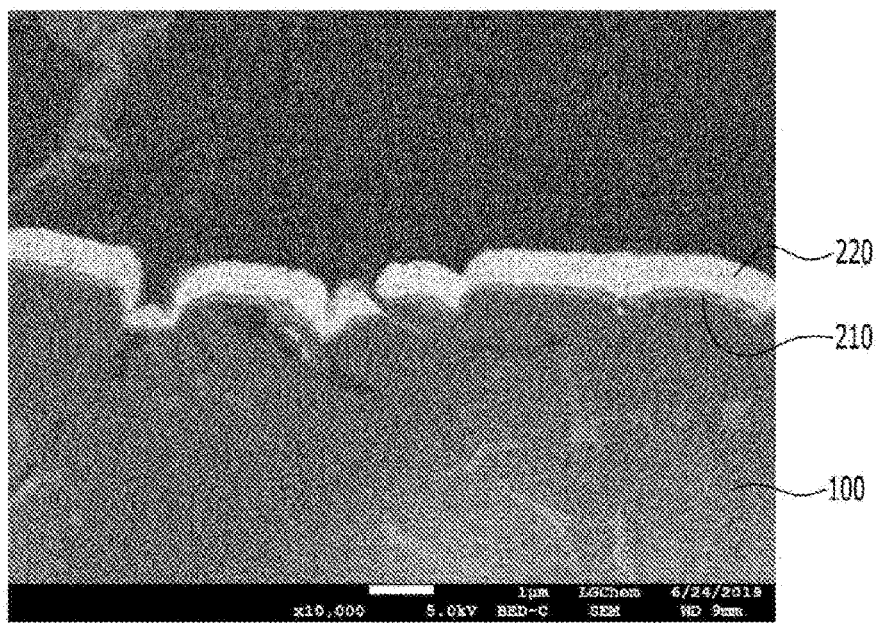

[FIG. 5]
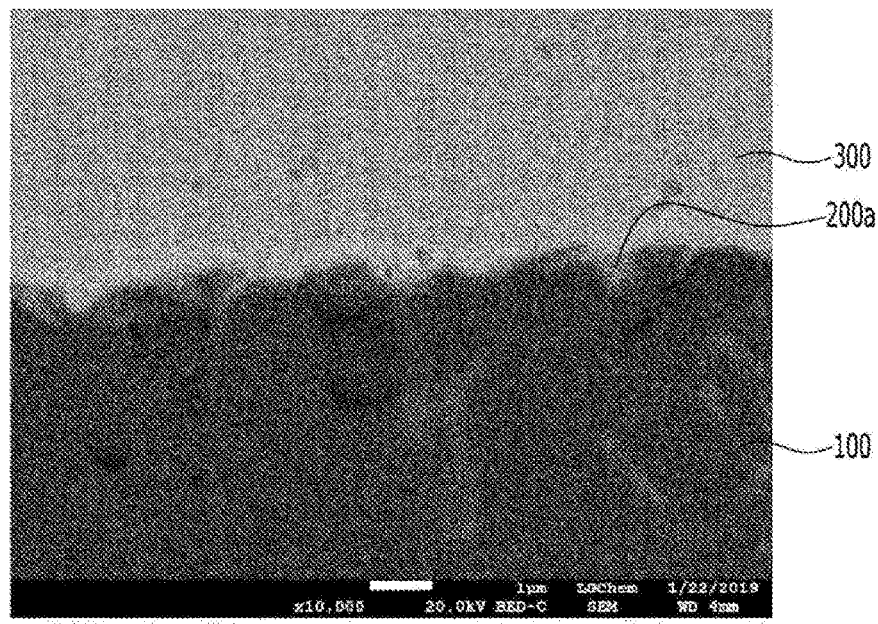

METHOD FOR MANUFACTURING PRINTED CIRCUIT BOARD

TECHNICAL FIELD

This application is a 35 U.S.C. 371 National Phase Entry Application from PCT/KR2022/001097, filed Jan. 21, 2022, which claims the benefit of and priority from Korean Patent Application No. 10-2021-0008707 filed on Jan. 21, 2021 with the Korean Intellectual Property Office, the entire disclosures of which are herein incorporated by reference in their entirety. This application relates to a method for manufacturing a printed circuit board. More specifically, the present application relates to a method for manufacturing a printed circuit board capable of reducing production costs and improving bonding strength between layers forming the board.

BACKGROUND ART

In accordance with the trend of miniaturization, light weight, and high functionality of electronic devices, the application field of build-up printed circuit boards has been expanded centering on small devices. Accordingly, the demand for multilayer printed circuit boards is increasing.

Boards for multi-layer printed circuits are capable of wiring from flat to three-dimensional wiring. And especially in the field of industrial electronics, the integration of functional elements (e.g., IC (integrated circuit) or LSI (large scale integration, etc.) is improved, and boards for multi-layer printed circuits are also products that are advantageous for miniaturization, light weight, high functionality, structural and electrical function integration of electronic devices, reduction of assembly time, and cost reduction.

A substrate for a printed circuit can be manufactured by bonding a metal sheet such as a copper sheet to opposite sides of a ceramic substrate formed of alumina ($Al_2O_3$), aluminum nitride (AlN), or silicon nitride ($Si_3N_4$) or like.

Bonding methods for printed circuit boards can be largely divided into three types as follows. There are active metal brazing (AMB) using a paste mainly composed of Ag, direct bonding using an oxide layer of a ceramic substrate, and diffusion bonding using a metal deposition and diffusion reaction.

Among them, the active metal method has a problem in that Ag diffuses to an edge portion during operation of the power semiconductor module, and the direct bonding method has a problem in that thermal conductivity is lowered by an oxide layer. On the other hand, the diffusion bonding method can form a thin deposition layer with a thickness of several hundred nanometers by solid phase reaction, so the amount of metal such as Ag used is extremely small compared to the active metal method. In addition, since the bonding strength is excellent, there is an advantage in that it is possible to manufacture a printed circuit board having excellent thermal shock characteristics.

On the other hand, the printed circuit board is repeatedly exposed to heat by application of a voltage or subjected to a thermal shock condition due to a change in the surrounding environment. At this time, thermal stress is generated because the thermal expansion coefficients of the ceramic substrate and the metal sheet (eg, copper sheet) are different, and peeling is likely to occur due to repeated thermal shock.

Therefore, there is a need for a technique for manufacturing a printed circuit board having strong interlayer bonding strength while reducing production costs.

DISCLOSURE

Technical Problem

One object of the present application is to provide a method for manufacturing a printed circuit board capable of reducing production costs.

Another object of the present application is to provide a printed circuit board having strong interlayer bonding strength so that peeling does not occur even in a thermal shock environment.

The above and other objects of the present application can all be solved by the present application described in detail below.

Technical Solution

In order to achieve the above object, in one aspect, a manufacturing method of printed circuit board comprising, a first step, wherein a ceramic substrate (a) in which the areas of upper and lower surfaces facing each other are $S_A$ is prepared, a deposition layers are formed on the upper and lower surfaces of the ceramic substrate having the area $S_A$, and manufacturing a ceramic substrate (A) having an upper deposition layer and a lower deposition layer respectively formed on the upper and lower surfaces facing each other; a second step of preparing an upper metal sheet (B) and a lower metal sheet (B') having one surface having an area $S_B$ 1.5 times or more larger than the area $S_A$; a third step, wherein the metal sheets (B, B') and the two or more ceramic substrates (A) are disposing, so that two or more ceramic substrates (A) are positioned side by side in a plane between one surface of the area $S_B$ of the upper metal sheet (B) and the lower metal sheet (B') facing each other; and a fourth step of hot-pressing the upper and lower metal sheets (B, B') to bond the metal sheets (B, B') and the ceramic substrate (A) via the upper and lower deposition layers.

Advantageous Effects

According to the present application, it is possible to manufacture a printed circuit board having excellent bonding strength between a ceramic substrate and a metal sheet, and the manufacturing cost thereof can be reduced.

DESCRIPTION OF DRAWINGS

FIG. 1 is a schematic cross-sectional view of a ceramic substrate 100, a deposition layer 200, and a metal sheet 300 in relation to a manufacturing process for a printed circuit board according to an embodiment of the present application.

FIG. 2 schematically shows the arrangement relationship between the metal sheet and the ceramic substrate in the related art and in the present application.

FIG. 3 is a cross-sectional view of a printed circuit board including a ceramic substrate 100, a bonding layer 200a, and a metal sheet 300 according to an embodiment of the present application.

FIG. 4 is a scanning electron microscope (SEM) image of a cross-section of a ceramic substrate and a deposition layer formed according to an embodiment of the present application.

FIG. 5 is a scanning electron microscope (SEM) image of cross-sections of a ceramic substrate, a bonding layer, and a metal sheet formed according to an embodiment of the present application.

MODE FOR INVENTION

Hereinafter, the present application will be described in detail with reference to the accompanying drawings relating to specific examples of the present application.

For a clear description, parts irrelevant to the description are omitted from the drawings, and the same reference numerals are used for the same or similar elements throughout the specification. In addition, since the size and thickness of each element shown in the drawings are arbitrarily exaggerated or reduced for convenience of description, the size and thickness of the elements of the present application are not necessarily limited to those shown.

In this specification, the term "above" used in relation to a position between elements is used in a meaning corresponding to 'above' or 'upper', and unless otherwise specified, an element having a corresponding position is directly in contact with another element, it may mean a case existing above it, or it may mean a case where another element exists between them.

In this specification, "area", unless otherwise defined, when each element is observed from the top or bottom in a direction parallel to the normal direction of the surface, the area in which the corresponding element is visible, for example, it may mean a projection area.

Throughout this specification, the terms "include" or "have" mean that other elements can be further included unless otherwise specified.

In this specification, the terms "step" and "process" can be used interchangeably with the same meaning.

In an example relating to the present application, the present application relates to a method of manufacturing a substrate for a printed circuit. The method can be performed by manufacturing a laminate in which predetermined elements are laminated and hot-pressing the laminate.

For example, as shown in FIG. 1, the manufacturing method can be performed in the following manner. First, a ceramic substrate 100 is prepared, and a deposition layer 200 is formed on two opposing surfaces of the ceramic substrate 100. After the metal sheet 300 is placed on the deposition layer 200, the ceramic substrate 100 and the metal sheet 300 are bonded by hot pressing the metal sheet outside the metal sheet.

According to the specific example of the present application related to the manufacturing process, the area of the ceramic substrate and the metal sheet and/or the stacking position before bonding thereof can be adjusted, and thus the production cost can be reduced.

In addition, according to the specific example of the present application, excellent adhesion between the ceramic substrate and the metal sheet can be provided by adjusting deposition elements and their contents.

Specifically, A manufacturing method of printed circuit board comprising,

A first step, wherein a ceramic substrate (a) in which the areas of upper and lower surfaces facing each other are $S_A$ is prepared, a deposition layers are formed on the upper and lower surfaces of the ceramic substrate having the area $S_A$, and manufacturing a ceramic substrate (A) having an upper deposition layer and a lower deposition layer respectively formed on the upper and lower surfaces facing each other;

A second step of preparing an upper metal sheet (B) and a lower metal sheet (B') having one surface having an area $S_B$ 1.5 times or more larger than the area $S_A$;

A third step, wherein the metal sheets (B, B') and the two or more ceramic substrates (A) are disposing, so that two or more ceramic substrates (A) are positioned side by side in a plane between one surface of the area $S_B$ of the upper metal sheet (B) and the lower metal sheet (B') facing each other; and A fourth step of hot-pressing the upper and lower metal sheets (B, B') to bond the metal sheets (B, B') and the ceramic substrate (A) via the upper and lower deposition layers;

included.

Hereinafter, each step and an element used in each step will be described in more detail.

The ceramic substrate (a) mentioned in relation to the first step is a substrate capable of providing a kind of heat dissipation performance in a printed circuit board. The type of element used for the ceramic substrate is not particularly limited as long as it can provide heat dissipation performance.

In one example, the ceramic substrate (a) can include at least one of $Si_3N_4$, AlN, or $Al_2O_3$. Specifically, the ceramic substrate (a) can include at least one selected from $Si_3N_4$ and AlN.

In one example, the ceramic substrate (a) can include at least $Si_3N_4$. The flexural strength of $Si_3N_4$ is generally in the range of 600 to 1,400 MPa, which is the highest among ceramics. In addition, $Si_3N_4$ is a material that can be used at high temperatures because it has a low coefficient of thermal expansion of about $3.2 \times 10^{-6}$/K. In addition, $Si_3N_4$ has a density of about 3.2 g/cm$^3$, a thermal conductivity ranging from 30 to 178 W/(m K), and a high thermal shock resistance ranging from 800 to 1000 K. Also, $Si_3N_4$ with these characteristics is an effective heat dissipation material. Thus, $Si_3N_4$ with these characteristics is an effective heat dissipation material. So, a printed circuit board manufactured using the board including $Si_3N_4$ can function as a circuit board with excellent heat dissipation performance.

A process or method for manufacturing the ceramic substrate (a) is not particularly limited.

For example, the ceramic substrate (a) can be manufactured through a slurry preparation process including ceramic powder, a tape casting process, a punching process, a burnout process, a sintering process, and the like.

The slurry preparation process can be a process of preparing a slurry by mixing an organic solvent, a sintering aid, a plasticizer, and a dispersant with powder. In this case, the ceramic powder can include at least one or more of $Si_3N_4$ powder, AlN powder, or $Al_2O_3$ powder. The powder can be prepared using a ball mill or the like. At this time, the average particle diameter of the powder is preferably 0.8 μm or less. At this time, the average particle diameter means the size of the particle diameter that is the median value in the particle size distribution of n particles used. For example, when the sizes of 100 particles are arranged in order from the largest to the smallest, the size of the 50th particle can be referred to as the average particle diameter.

In one example, when $Si_3N_4$ powder is used, the $Si_3N_4$ powder can include at least one of β-$Si_3N_4$ or α-$Si_3N_4$. When β-$Si_3N_4$ and α-$Si_3N_4$ are mixed and used as $Si_3N_4$ powder, the content (eg, weight) ratio between the components to be mixed is not particularly limited.

The type of the organic solvent is not particularly limited, but, for example, at least one selected from the group consisting of toluene, benzene, xylene, methyl ethyl ketone (MEK), propylene glycol monomethyl ether acetate (PG-MEA), propylene glycol monomethyl ether (PGME), ethanol, butanol or methanol can be used.

The type of the sintering aid is not particularly limited, but, for example, oxides of rare earth elements, oxides of alkaline earth metals, or combinations thereof can be used.

The type of the plasticizer is not particularly limited either. For example, at least one selected from the group consisting of di-2-ethylhexyl phthalate, di-normal-butyl butalate, butyl phthalyl butyl glycolate, polyethylene glycol, or dioctyl phthalate can be used as the plasticizer.

The dispersing agent is also not particularly limited, and for example, at least one selected from the group consisting of a polyester-based dispersing agent, a polyacrylate-based dispersing agent, a polyurethane-based dispersing agent, or a polyether-based dispersing agent can be used.

The tape casting process can be a process of manufacturing a ceramic tape such as, for example, a $Si_3N_4$ tape by applying the slurry to a predetermined thickness on a polymer film and then passing the slurry through a drying chamber.

The punching process can be a process of manufacturing a ceramic green sheet such as, for example, a $Si_3N_4$ green sheet by pressing and cutting the ceramic tape.

The burnout process can be a process performed by heat-treating the green sheet (eg, $Si_3N_4$ green sheet). Specifically, the burnout process can be performed by heat treatment in air or nitrogen atmosphere. Specific heat treatment conditions are not particularly limited, but, for example, the heat treatment can be performed at a temperature in the range of 400 to 800° C. for 6 to 18 hours.

The sintering process can be a process of sintering the degreased green sheet (eg, $Si_3N_4$ green sheet). The sintering can be performed by gas pressure sintering (GPS). Specific gas pressure sintering conditions are not particularly limited, but, for example, a gas pressure sintering furnace in which a temperature in the range of 1600 to 2000° C., a nitrogen atmosphere, and 8 to 12 atm conditions are formed can be used for the sintering process.

After the sintering, a ceramic substrate (a) including at least one of $Si_3N_4$, AlN, or $Al_2O_3$ can be manufactured through post-processing including grinding.

The ceramic substrate (a) manufactured through the above-described process can be a substrate in which areas of upper and lower surfaces facing each other are $S_A$. At this time, the expression upper and lower surfaces is only a term for describing the relative position of two surfaces facing each other, and does not mean an absolute position.

The shape of the ceramic substrate or the upper and lower surfaces forming the substrate is not particularly limited. For example, the ceramic substrate can be a plate-shaped plate, and upper and lower surfaces thereof can have a polygonal (eg, quadrangular) or circular shape.

In one example, the shape of the upper and lower surfaces facing each other of the ceramic substrate (a) (or the shape in which the area $S_A$ of these surfaces is visible can be a rectangular shape. Although not particularly limited, the size of the ceramic substrate (a) having a rectangular area $S_A$ can be, for example, 150 to 220 mm in width and 100 to 160 mm in length.

In addition, although not particularly limited, the thickness of the ceramic substrate may range from 0.05 to 2.0 mm.

According to the specific example of the present application, deposition layers can be formed on upper and lower surfaces of the ceramic substrate (a) facing each other forming the ceramic substrate (a). As described above, the opposing upper and lower surfaces on which the deposition layer is formed can have an area $S_A$.

The deposition layer can bond the metal sheet and the ceramic substrate after a hot press described below is applied.

The deposition (process) of forming the deposition layer is not particularly limited. For example, a known deposition method such as sputtering for physical vapor deposition (PVD) or chemical vapor deposition (CVD) can be used.

Although not particularly limited, an area where the deposition layer is formed on the ceramic substrate can be 50% to 100% of the $S_A$ area. For example, the deposition layers formed on the upper and lower surfaces of the ceramic substrate (a) can have the same area size as the upper and lower surfaces.

In one example, the deposition layers formed on the upper and lower surfaces of the ceramic substrate (a) can have the same area shape as those of the upper and lower surfaces. In this case, the fact that the area shapes are the same includes not only cases where the areas and shapes are all identical, but also cases where the geometric shapes of the areas are similar to each other (similarity shape) even though the sizes of the areas are different.

In one example, the deposition layer formed on the upper and lower surfaces of the ceramic substrate (a) can have the same area size and area shape as those of the upper and lower surfaces on which the deposition layer is formed.

The type of components used to form the deposition layer is not particularly limited. For example, the deposition layer can include at least one of Ag or Ti.

In one example, the deposition layer can include Ag or Ti. Specifically, in the deposition layer, the Ag deposition amount per unit area can be 3.50 to 6.10 $g/m^2$, and the Ti deposition amount per unit area can be 0.61 to 1.30 $g/m^2$. In this case, the "deposition amount per unit area" may mean the content (g) of the deposition component (Ti or Ag) with respect to the area ($m^2$) of the deposition layer formed by deposition. In the case of adjusting the composition and deposition amount of the deposition layer as described above, bonding strength can be improved.

In one example, the deposition amount per unit area of Ti included in the deposition layer can be in the range of 0.61 to 1.30 $g/m^2$. In terms of providing a stronger bond between the metal sheet and the ceramic substrate, the amount of Ti deposited per unit area is preferably in the range of 1.02 to 1.30 $g/m^2$, and more preferably in the range of 1.04 to 1.20 $g/m^2$.

In one example, the deposition amount per unit area of Ag included in the deposition layer can be in the range of 3.50 to 6.10 $g/m^2$. In terms of providing a stronger bonding strength between the metal sheet and the ceramic substrate, the Ag deposition amount per unit area is preferably in the range of 4.00 to 4.60 $g/m^2$.

As a result of the deposition layers being formed on the upper and lower surfaces of the ceramic substrate (a) facing each other as described above, a ceramic substrate (A) in which an upper deposition layer and a lower deposition layer are respectively formed on the upper and lower surfaces facing each other can be manufactured. In this case, the upper deposition layer is a deposition layer formed on the upper surface, and the lower deposition layer is a deposition layer formed on the lower surface.

As described in relation to the third and fourth steps below, the upper deposition layer can be disposed facing the upper metal sheet B, and the lower deposition layer can be disposed facing the lower metal sheet B'. Through subsequent hot pressing, these deposition layers may function as a medium for bonding the metal sheets (B, B') and the ceramic substrate (A).

In one example, at least one of the upper deposition layer and the lower deposition layer can include a first deposition layer and a second deposition layer having different components from each other. Specifically, the first deposition layer can include Ti, and the second deposition layer can include Ag. In this case, the first deposition layer means a layer closer to the ceramic substrate (a) than the second deposition layer. That is, the first deposition layer may refer to a layer formed on the upper and lower surfaces of the ceramic substrate, and the second deposition layer may refer to a layer formed on the first deposition layer. For example, as shown in FIG. 1, a first deposition layer 210 can be formed on the ceramic substrate 100 and a second deposition layer 220 can be formed on the first deposition layer.

Regarding the first deposition layer and the second deposition layer, the deposition (process) of the method includes forming (depositing) the first deposition layer containing Ti on the upper and lower surfaces of the ceramic substrate (a), respectively; and forming (depositing) the second deposition layer including Ag on the first layer. Accordingly, as shown in FIG. 1, the second deposition layer 220, the first deposition layer 210, the ceramic substrate 100, the first deposition layer 210, and the second deposition layer 220 are sequentially disposed. A laminate (ie, ceramic substrate (A)) can be manufactured.

In one example, the first deposition layer may refer to a deposition layer directly formed on the upper and lower surfaces of the ceramic substrate.

In one example, the second deposition layer may refer to a deposition layer directly formed on the first deposition layer.

Although not particularly limited, an area in which the first deposition layer and the second deposition layer are formed on the ceramic substrate can be 50% to 100% of the $S_A$ area.

In one example, the first deposition layer can have the same area shape as the upper and lower surfaces.

In one example, the first deposition layer can have the same area size and area shape as those of the upper and lower surfaces.

In one example, the second deposition layer can have the same area shape as the first deposition layer.

In one example, the second deposition layer can have the same area size and area shape as those of the first deposition layer.

In one example, the deposition amount per unit area of Ti included in the first deposition layer can be in the range of 0.61 to 1.30 g/m². Specifically, the deposition amount per unit area of Ti can be in the range of 1.02 to 1.30 g/m², more specifically in the range of 1.04 to 1.20 g/m². This range of deposition amount of Ti is preferable in terms of providing a stronger bonding strength between the metal sheet and the ceramic substrate.

In one example, the deposition amount per unit area of Ag included in the second deposition layer can be in the range of 3.50 to 6.10 g/m². Specifically, the deposition amount of Ag per unit area is preferably in the range of 4.00 to 4.60 g/m² in view of providing stronger bonding strength between the metal sheet and the ceramic substrate.

The second step is a step of preparing an upper metal sheet (B) and a lower metal sheet (B') to be positioned on the upper and lower deposition layers. For example, as shown in FIG. 1, two prepared metal sheets 300 are positioned on each deposition layer 200.

In order to explain the method of performing the third and fourth steps, it has been described that the second step of preparing the metal sheet (B) is performed after the first step of manufacturing the ceramic substrate (A), but changing the order of the first and second steps is an obvious modification that can be made by one skilled in the art.

The metal sheets (B, B') used in the specific example of the present application have one surface having a predetermined area size. Specifically, one surface of the metal sheets B and B' has an area $S_B$ larger than the area $S_A$ of the upper and lower surfaces of the ceramic substrate. More specifically, the area $S_B$ of one side of the metal sheet B is 1.5 times larger than the area $S_A$. As described below, a metal sheet having the area $S_B$ allows two or more ceramic substrates A to be arranged side by side in a plane on one side of the $S_B$ area, and as a result, production cost can be reduced.

In one example, the area $S_B$ can be 6.0 times or less, 5.0 times or less, 4.0 times or less, 3.0 times or less, or 2.5 times or less of the area $S_A$. More specifically, the area $S_B$ can be 1.6 times or more, 1.7 times or more, 1.8 times or more, 1.9 times or more, or 2.0 times or more of the area $S_A$, and 2.4 times or less, 2.3 times or less, or 2.2 times or less, or 2.1 times or less. When the area $S_B$ is excessively large, there can be problems in that the etching solution is not washed off well and pools on the substrate (etching solution remains) or the etching is non-uniform.

In one example, the shape of the metal sheet can be the same as that of the ceramic substrate.

In a specific example of the present application, when the upper and lower surfaces of the ceramic substrate having an area $S_A$ and one surface of the metal sheets B and B' having an area $S_B$ have a rectangular shape, the size of the metal sheets B and B' can be, for example, 250 to 300 mm in width and 160 to 210 mm in length.

In addition, although not particularly limited, the thickness of the metal sheets B and B' may range from 0.05 to 3.0 mm.

The type of metal included in the metal sheet (B) is not particularly limited. For example, the metal sheet (B) can include one or more selected from Cu, Al, Ni, or Fe.

The third step is a step of arranging the ceramic substrate A and the metal sheets B and B' so that two or more ceramic substrates A are positioned on the metal sheet side by side in a plane. According to the specific example of the present application, the size and shape of two or more ceramic substrates A can be the same.

Specifically, the third step is such that two or more ceramic substrates A are positioned side by side in a plane between one surface of the area $S_B$ of the upper metal sheet B and the lower metal sheet B' facing each other. This is a step of disposing the metal sheets (B, B') and the two or more ceramic substrates (A).

Regarding the above three steps, the fact that two or more ceramic substrates A are positioned side by side in a plane means that the two or more ceramic substrates A positioned on the metal sheets B and B' do not overlap each other, that is, non-laminated. Accordingly, the two or more ceramic substrates A positioned on the metal sheet through the third step do not have overlapping areas, and the overlapping area between the ceramic substrates A is zero.

According to the arrangement in step 3, the upper metal sheet (B) is positioned so that one side of the upper metal sheet (B) having the area $S_B$ faces the upper deposition layer (of all two or more ceramic substrates). In addition, the lower metal sheet (B') is positioned so that one surface of the lower metal sheet (B') having the area $S_B$ faces the lower deposition layer (of all of the two or more ceramic substrates). Then, in the subsequent fourth step of hot pressing, two or more ceramic substrates (A) positioned side by side in a plane between the metal sheets (B, B') (through the upper and lower deposition layers) are bonded to the metal sheets (B, B'). For example, the upper metal sheet (B) is bonded to the upper surfaces of all two or more ceramic substrates via the upper deposition layer. The lower metal sheet B' is bonded to the lower surfaces of all two or more ceramic substrates via the lower deposition layer.

In one example, the upper deposition layer can be disposed to directly contact or directly face one surface of the metal sheet having an area $S_B$.

In one example, the lower deposition layer can be disposed to directly contact or directly face one surface of the metal sheet having an area $S_B$.

In one example, in relation to the arrangement of the metal sheets (B, B') and the ceramic substrate (A), in the third step, the overlapping area between one surface of the metal sheet having the area $S_B$ and the two or more ceramic substrates A can be performed to be 70% or more a total area ($S_T = n \times S_A$, where n is a natural number equal to or greater than 2, and which means the number of ceramic substrates positioned between the metal sheets (B, B')) of the ceramic substrate (A) positioned between the upper metal sheet (B) and the lower metal sheet (B'). For example, the overlapping area is 75% or more, 80% or more, 85% or more, 90% or more or greater than 95% of the total area of the ceramic substrate (A) positioned between the upper metal sheet (B) and the lower metal sheet (B').

Hot pressing described later can be performed on the laminated body arranged as described above. When the hot pressing is performed, two or more ceramic substrates (A) positioned side by side on the same plane between the upper metal sheet (B) and the lower metal sheet (B') are deposited between the upper metal sheet (B) and the lower metal sheet (B') via deposition layer or a structure derived there from.

In the related art, it is common to bond a ceramic substrate and a metal sheet having the same area. However, in the present application, a metal sheet having an area ($S_B$) at least 1.5 times larger than the area ($S_A$) of the ceramic substrate is used (see FIG. 2). Etching is performed in the manufacture of printed circuit boards, and through the above arrangement, if two or more ceramic substrates are to be subjected to a single etching process, the effective area increases and more etching pieces can be produced. Also, at the same time, the discarded portion is reduced. And, in the related art, one substrate to be etched was put into the line for the etching process, but in the case of disposing as described above, compared to the related art, there is an effect of putting two substrates into the etching line. Due to this, there is an effect of shortening the process time and reducing related costs (eg, labor costs, etc.). In addition, in the printing process, a process of attaching a protective film to a portion not to be etched can be added. As described above, since there is an effect of attaching the film to the area of two sheets, there is an effect of reducing time and costs (eg, labor costs) for related processes. As such, production costs can be reduced according to the present application.

In one example, in relation to the arrangement of the metal sheets (B, B') and the ceramic substrate (A), the at least two ceramic substrates A can be disposed on one surface of the metal sheet while being spaced apart from the edges of the metal sheets B and B' by a predetermined distance. When it is spaced apart from the edge of the metal sheet, it is possible to secure a place to be clamped by a jig during the process. As a result, since the distance between two or more ceramic substrates becomes closer, a dead zone is reduced and waste of raw materials can be prevented.

According to the specific example of the present application, through the above three steps, one set of master cards formed of non-bonded laminates can be obtained. The non-bonded laminate has a structure of a metal sheet (B)/two or more ceramic substrates (A) (located side by side in a plane)/metal sheet (B').

In one example, the method may further include manufacturing a stack of master cards. At this time, an anti-adhesion sheet formed of a different material can be inserted between each set to prevent adhesion between the metal sheets 300. The anti-adhesion sheet as described above can include, for example, graphite. Although not particularly limited, a known bonding technique or bonding material can be used to form the stack.

The fourth step is to bond the upper and lower metal sheets B and B' and the ceramic substrate A by hot pressing the upper and lower metal sheets B and B' positioned on the deposition layer.

In the fourth step, for example, at a temperature of 450 to 1,300° C., at a pressure of 1 to 25 MPa, it can be performed while hot pressing the metal sheets (B, B') in the direction where the ceramic substrate (A) is located. Although not particularly limited, the hot pressing, for example, can be performed in a vacuum atmosphere of about 101 to 10-torr.

In one example, the lower limit of the bonding temperature can be 500° C. or higher, 600° C. or higher, 700° C. or higher, or 800° C. or higher. And, the upper limit can be, for example, 1050° C. or less, 1000° C. or less, 950° C. or less, or 900° C. or less.

In one example, the lower limit of the pressure at the time of bonding can be, for example, 5 Mpa or more or 10 Mpa or more. And, the upper limit can be, for example, 20 Mpa or less or 15 Mpa or less.

Through the hot pressing, the metal sheets B and B' and the ceramic substrate A can be bonded via a deposition layer (or a layer including components derived from the deposition layer). For example, FIG. 3 is a schematic diagram showing a cross-sectional view of a substrate or laminate obtained after a bonding step according to an embodiment of the present application. As shown in FIG. 3, the laminate obtained after bonding has a structure in which a bonding layer 200a and a metal sheet 300 are sequentially formed on the upper and lower surfaces of the ceramic substrate 100, respectively. At this time, the bonding layer 200a is a deposition layer or a layer derived from a deposition layer that has undergone a bonding step.

Referring to FIGS. 1 and 3 to 5, diffusion between materials included in each of the ceramic substrate 100, the deposition layer 200, and the metal sheet 300 can be achieved due to hot pressing. For example, when Ti is included in the first deposition layer 210 and $Si_3N_4$ is included in the ceramic substrate (a) 100, a reaction as shown in Scheme 1 below may occur between Ti and $Si_3N_4$.

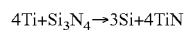

$$4Ti + Si_3N_4 \rightarrow 3Si + 4TiN \qquad \text{[Scheme 1]}$$

That is, by the hot press, a material included in the deposition layer 200 and a material included in the ceramic substrate 100 may react to form a bonding layer 200a, and the bonding layer 200a can include TiN.

The bonding layer 200a according to the present embodiment is a layer containing TiN and may act as a strong bonding medium layer between the ceramic substrate 100 and the metal sheet 300. That is, bonding of the ceramic substrate 100 and the metal sheet 300 can be performed by forming the bonding layer 200a through the diffusion bonding method.

As described above, in the deposition step, the deposition amount of Ag included in the second deposition layer 220 per unit area can be in the range of 3.50 to 6.10 g/m². More specifically, the deposition amount per unit area of Ag included in the second deposition layer 220 can be, for example, in the range of 4.00 to 4.60 g/m². When bonding between layers including different materials is performed, desorption between layers may easily occur while stress transfer occurs in a layer including a material having relatively low strength. Accordingly, increasing the strength of a layer including a material having relatively low strength can be more effective in improving bonding strength in bonding between layers including different materials. For example, Ag included in the second deposition layer 220 diffuses toward the metal sheet 300 including Cu during the hot pressing to compensate for the strength of the weak metal sheet 300 at the interface. According to the above principle, Ag included in the second deposition layer 220 may improve bonding strength between the ceramic substrate 100 and the metal sheet 300. In addition, Ag included in the second deposition layer 220 forms a liquid phase consisting of a Cu—Ti—Ag ternary system together with Ti included in the first deposition layer 210 and Cu included in the metal sheet 300. This may help promote the formation of reactive layer by improving wettability.

When the deposition amount of Ag per unit area included in the second deposition layer 220 is less than the above range, the strength of the metal sheet 300 cannot be sufficiently increased, resulting in poor bonding strength between the ceramic substrate 100 and the metal sheet 300. In addition, when the deposition amount per unit area of Ag included in the second deposition layer 220 exceeds the above range, more than necessary Ag can be deposited. Due to this, there is a problem in that the bonding strength between the ceramic substrate 100 and the metal sheet 300 is rather reduced because Ag residues that are not diffused are formed.

The deposition amount per unit area of Ti included in the first deposition layer 210 is in the range of 0.61 to 1.30 g/m², specifically, for example, preferably in the range of 1.02 to 1.30 g/m², and 1.04 to 1.20 g/m² range is more preferable. The deposition amount of Ti per unit area is related to the thickness of the bonding layer 200a, and affects the bonding strength between the ceramic substrate 100 and the metal sheet 300.

When the amount of deposition per unit area of Ti included in the first deposition layer 210 is less than the above range, the thickness of the bonding layer 200a is not sufficient, resulting in poor bonding strength between the ceramic substrate 100 and the metal sheet 300. For example, as in comparative Example below, bonding strength between the ceramic substrate 100 and the metal sheet 300 can be less than 9 N/mm. In addition, when the deposition amount per unit area of Ti included in the first deposition layer 210 exceeds the above range, the deposition amount reaches a saturation value, so the degree of increase in bonding strength is small, and raw materials are wasted.

As described above, in the method for manufacturing a printed circuit board according to the present application, the deposition amount per unit area of Ag is adjusted to the range of 3.50 to 6.10 g/m², and the amount of deposition per unit area of Ti is adjusted to the range from 0.61 to 1.30 g/m². By doing so, it is possible to manufacture a substrate for a printed circuit having excellent interlayer bonding strength. Accordingly, even when the printed circuit board manufactured as described above is exposed to a repetitive thermal shock environment, peeling does not occur or the occurrence of peeling is greatly suppressed.

In one example, the method may further include an etching step for the metal sheets B and B'. Specifically, after the bonding step, a substrate for a printed circuit can be manufactured through a resist printing process, an etching process, a plating process, and the like with respect to the bonded ceramic substrate 100 and/or the metal sheet 300.

In FIG. 2, a red arrow indicates a direction of hot pressing, and a master card (MC) refers to a laminate in the form of a metal sheet/ceramic substrate/metal sheet. The present invention, in which two ceramic substrates are arranged side by side on a plane and then bonded, has a high yield and a low etching unit cost compared to the related art.

FIG. 4 is a cross-sectional image after the deposition step and before the bonding step. 4, it can be seen that the first layer 210 including Ti and the second layer 220 including Ag are formed on the ceramic substrate 100.

FIG. 5 is a cross-sectional photograph after the bonding step. From FIG. 5, it can be confirmed that the bonding layer 200a is formed after the bonding step through the diffusion bonding method, and thus the ceramic substrate 100 and the metal sheet 300 are bonded.

Hereinafter, the action and effect of the invention will be described in more detail through specific examples of the invention. However, this is presented as an example of the invention, and thereby the scope of the invention is not limited in any sense.

Manufacturing Example (Manufacture of Ceramic Substrate (a))

$Si_3N_4$ powder having an average particle diameter of 0.8 μm or less is prepared through a ball mill. Organic solvent (e.g. toluene, methanol, ethanol), sintering aid (e.g. $Y_2O_3$, MgO), plasticizer (e.g. Dioctyl Phthalate (DOP), Polyethylen glycol (PEG)) and dispersant (e.g. BYK-111) in $Si_3N_4$ powder is added to prepare a slurry, and then passed through a drying chamber to prepare a $Si_3N_4$ tape. A $Si_3N_4$ green sheet was prepared by pressing and cutting the $Si_3N_4$ tape, and a burnout process was performed by heat treatment at 600° C. for 12 hours. Thereafter, a ceramic substrate (a) (silicon nitride $Si_3N_4$ substrate) having a predetermined size (190 mm wide×138 mm long×0.32 mm thick) was prepared by sintering under a nitrogen atmosphere at 1850° C. and 1 MPa using a gas pressure sintering method.

Experiment 1: Confirmation of Production Cost Reduction

Ti (first deposition layer) and Ag (second deposition layer) were sequentially deposited on the opposite upper and lower surfaces of the ceramic substrate of production example. At this time, about 1.0 g/m² of Ti was deposited and about 6.08 g/m² of Ag was deposited. Two ceramic substrates (A) were prepared and deposited on both upper and lower surfaces of the first and second deposition layers facing each other.

In addition, two copper sheets having a size of 270 mm×190 mm×0.3 mm were prepared.

After placing the copper sheet, two ceramic substrates (A) were placed on one surface of the copper sheet by placing them adjacent to each other so as to minimize a gap between the two ceramic substrates (A) (At this time, two or more ceramic substrates (A) are placed side by side in a plane on the copper sheet, and the deposition layer (Ag deposition layer) of each ceramic substrate (A) is disposed so as to be in contact with the copper sheet). A non-bonded laminate in the form of a copper sheet/two ceramic substrates (A) (placed side by side in a plane)/copper sheet was produced by placing the remaining one sheet of copper sheet thereon in the same manner. At this time, the overlapping area between the two ceramic substrates and the copper sheet was about 90%.

Thereafter, the laminate was treated with a hot press equipment while pressing at 15 MPa in an atmosphere of about $10^{-4}$ torr and a temperature of 980° C. As a result, a sample of a copper sheet in which a copper sheet and a silicon nitride substrate were bonded to each other/two ceramic substrates (A) (positioned side by side in a plane)/copper sheet was obtained.

Copper was etched to manufacture a copper circuit using the sample. Specifically, after attaching a dry film on both sides of the outer side of the laminate, UV is irradiated on the film, leaving a portion (circuit portion) where copper is not to be etched, and the film in the remaining portion other than the circuit portion is peeled off. This was put into an etching line to perform copper etching.

As a result, the time required to make the same number of circuits can be reduced by almost half when etching the sample manufactured as in the present application (copper sheet/two ceramic substrates (A)(placed side by side)/copper sheet), compared to etching two comparative samples (copper sheet/one ceramic substrates (A)/copper sheet) to which ceramic substrates are bonded one by one. In addition, it was confirmed that more circuit board pieces could be produced (eg, increased production by about 30% or more) even during the same etching process time. As such, according to the present application, the cost reduction effect is large.

Experimental Example 2: Evaluation of Joint Strength

In accordance with ASTM D6682, bonding strength (N/mm) was measured for the specimens of Examples 1 to 6 and Comparative Examples 1 to 6 below. Specifically, a sample having a copper sheet/silicon nitride substrate/copper sheet structure in which a copper sheet and a silicon nitride substrate are bonded to each other was etched, and a sample in which a copper strip having a width of 5 mm and a length of 100 mm was bonded to a ceramic substrate was prepared. About 10 mm of the end of the Cu strip was manually separated before the test so that the Cu strip could be held by the grip of a universal testing machine (equipment manufacturer and model name: Ametek, LS5). The specimen was fixed in the universal testing machine, and the Cu strip was held with a grip, separated at a speed of 50 mm/min, and the stress thereof was measured to calculate the bonding strength.

The results are shown in Tables 1 to 3 below.

Example 1 (Ti Deposition Amount 1.076 g/m$^2$, Ag Deposition Amount 4.005 g/m$^2$)

A first deposition layer was formed by depositing 0.0282 g of Ti for 70 seconds through a sputtering method on the ceramic substrate of preparation example. Then, 0.105 g of Ag was deposited on the first layer for 30 seconds to form a second deposition layer. At this time, the formation area of the first deposition layer and the second deposition layer was adjusted to be the same as that of the ceramic substrate (a) (width 190 mm×length 138 mm). Here, the deposited amount per unit area of Ti is 1.076 g/m$^2$, and the amount deposited per unit area of Ag is 4.005 g/m$^2$.

In addition, two ceramic substrates (A) prepared as described above and two copper sheets (width 270 mm×length 185 mm×thickness 0.3 mm) were prepared. Two ceramic substrates (A) were placed on one side of one prepared copper sheet while placing the two ceramic substrates (A) adjacent to each other so as not to create a gap as much as possible (at this time, the two ceramic substrates (A) are placed side by side in a plane on the copper sheet, and the deposition layer (the second deposition layer containing Ag) of each ceramic substrate (A) is disposed so as to be in contact with the copper sheet). The remaining one copper sheet was placed on the two ceramic substrates (A) in the same manner to prepare a non-bonded laminate in the form of copper sheet/two ceramic substrates (A) (placed side by side in a plane)/copper sheet. At this time, the overlapping area between the two ceramic substrates and the copper sheet was about 95%.

Thereafter, the laminate was hot-pressed at a temperature of 980° C. and a pressure of 15 MPa in an atmosphere of about $10^{-4}$ torr.

Through the above series of processes, a specimen including a metal sheet of Cu, a bonding layer of TiN, and Si$_3$N$_4$ was prepared.

Example 2 (Ti Deposition Amount 1.194 g/m$^2$, Ag Deposition Amount 4.005 g/m$^2$)

Specimens including a metal sheet of Cu, a bonding layer of TiN, and a ceramic substrate of Si$_3$N$_4$ were prepared in the same manner as in Example 1, except that the first layer was formed by depositing 0.0313 g of Ti. At this time, the deposition amount per unit area of Ti is 1.194 g/m$^2$, and the amount of deposition per unit area of Ag is 4.005 g/m$^2$.

Example 3 (Ti Deposition Amount 1.030 g/m$^2$, Ag Deposition Amount 5.339 g/m$^2$)

Specimens including a metal sheet of Cu, a bonding layer of TiN, and a ceramic substrate of Si$_3$N$_4$ were prepared in the same manner as in Example 1, except that 0.0270 g of Ti was deposited to form the first layer and 0.1400 g of Ag was deposited to form the second layer. At this time, the deposition amount per unit area of Ti is 1.030 g/m$^2$, and the deposition amount of Ag per unit area is 5.339 g/m$^2$.

Example 4 (Ti Deposition Amount 1.220 g/m$^2$, Ag Deposition Amount 5.339 g/m$^2$)

Specimens including a metal sheet of Cu, a bonding layer of TiN, and a ceramic substrate of Si$_3$N$_4$ were prepared in the same manner as in Example 1, except that 0.0320 g of Ti was deposited to form the first layer and 0.1400 g of Ag was deposited to form the second layer. At this time, the deposition amount per unit area of Ti is 1.220 g/m$^2$, and the amount of deposition per unit area of Ag is 5.339 g/m$^2$.

Example 5 (Ti Deposition Amount 1.003 g/m$^2$, Ag Deposition Amount 4.005 g/m$^2$)

Specimens including a Cu metal sheet, a TiN bonding layer, and a Si$_3$N$_4$ ceramic substrate were prepared in the same manner as in Example 1, except that the first layer was formed by depositing 0.0263 g of Ti. At this time, the deposition amount per unit area of Ti is 1.003 g/m², and the deposition amount of Ag per unit area is 4.005 g/m².

Example 6 (Ti Deposition Amount 0.961 g/m², Ag Deposition Amount 4.005 g/m²)

Specimens including a Cu metal sheet, a TiN bonding layer, and a $Si_3N_4$ ceramic substrate were prepared in the same manner as in Example 1, except that the first layer was formed by depositing 0.0252 g of Ti. At this time, the deposition amount per unit area of Ti is 0.961 g/m², and the deposition amount per unit area of Ag is 4.005 g/m².

Comparative Example 1 (Ti Deposition Amount 0.374 g/m², Ag Deposition Amount 2.868 g/m²)

Specimens including a metal sheet of Cu, a bonding layer of TiN, and a ceramic substrate of $Si_3N_4$ were prepared in the same manner as in Example 1, except that 0.0098 g of Ti was deposited to form the first layer and 0.0752 g of Ag was deposited to form the second layer. At this time, the deposition amount per unit area of Ti is 0.374 g/m², and the deposition amount of Ag per unit area is 2.868 g/m².

Comparative Example 2 (Ti Deposition Amount 0.599 g/m², Ag Deposition Amount 2.868 g/m²)

Specimens including a metal sheet of Cu, a bonding layer of TiN, and a ceramic substrate of $Si_3N_4$ were prepared in the same manner as in Example 1, except that 0.0157 g of Ti was deposited to form the first layer and 0.0752 g of Ag was deposited to form the second layer. At this time, the deposition amount per unit area of Ti is 0.599 g/m2, and the deposition amount per unit area of Ag is 2.868 g/m².

Comparative Example 3 (Ti Deposition Amount 0.843 g/m², Ag Deposition Amount 2.868 g/m²)

Specimens including a metal sheet of Cu, a bonding layer of TiN, and a ceramic substrate of $Si_3N_4$ were prepared in the same manner as in Example 1, except that 0.0221 g of Ti was deposited to form the first layer and 0.0752 g of Ag was deposited to form the second layer. At this time, the deposition amount per unit area of Ti is 0.843 g/m², and the amount of deposition per unit area of Ag is 2.868 g/m².

Comparative Example 4 (Ti Deposition Amount 1.034 g/m², Ag Deposition Amount 2.868 g/m²)

Specimens including a metal sheet of Cu, a bonding layer of TiN, and a ceramic substrate of $Si_3N_4$ were prepared in the same manner as in Example 1, Except that 0.0342 g of Ti was deposited to form the first layer and 0.0752 g of Ag was deposited to form the second layer. At this time, the deposition amount per unit area of Ti is 1.304 g/m², and the deposition amount of Ag per unit area is 2.868 g/m².

Comparative Example 5 (Ti Deposition Amount 1.041 g/m², Ag Deposition Amount 6.808 g/m²)

Specimens including a metal sheet of Cu, a bonding layer of TiN, and a ceramic substrate of $Si_3N_4$ were prepared in the same manner as in Example 1, except that 0.0273 g of Ti was deposited to form the first layer and 0.1785 g of Ag was deposited to form the second layer. At this time, the deposition amount per unit area of Ti is 1.041 g/m², and the amount of deposition per unit area of Ag is 6.808 g/m².

Comparative Example 6 (Ti Deposition Amount 0.599 g/m², Ag Deposition Amount 4.005 g/m²)

Specimens including a Cu metal sheet, a TiN bonding layer, and a $Si_3N_4$ ceramic substrate were prepared in the same manner as in Example 1, except that the first layer was formed by depositing 0.0157 g of Ti. At this time, the deposition amount per unit area of Ti is 0.599 g/m², and the deposition amount of Ag per unit area is 4.005 g/m².

TABLE 1

|  | Example 1 | Example 2 | Example 3 | Example 4 |
|---|---|---|---|---|
| Ti deposition amount (g) | 0.0282 | 0.0313 | 0.0270 | 0.0320 |
| Ag deposition amount (g) | 0.105 | 0.105 | 0.1400 | 0.1400 |
| Ti deposition amount per unit area (g/m²) | 1.076 | 1.194 | 1.030 | 1.220 |
| Ag deposition amount per unit area (g/m²) | 4.005 | 4.005 | 5.339 | 5.339 |
| bonding strength (N/mm) | 21.4 | 22.1 | 16.3 | 20.3 |

TABLE 2

|  | Comparative Example 1 | Comparative Example 2 | Comparative Example 3 | Comparative Example 4 | Comparative Example 5 |
|---|---|---|---|---|---|
| Ti deposition amount (g) | 0.0098 | 0.0157 | 0.0221 | 0.0342 | 0.0273 |
| Ag deposition amount (g) | 0.0752 | 0.0752 | 0.0752 | 0.0752 | 0.1785 |
| Ti deposition amount per unit area (g/m²) | 0.374 | 0.599 | 0.843 | 1.304 | 1.041 |
| Ag deposition amount per unit area (g/m²) | 2.868 | 2.868 | 2.868 | 2.868 | 6.808 |
| bonding strength (N/mm) | 0.6 | 3.7 | 4.8 | 7.5 | 15.6 |

TABLE 3

|  | Example 5 | Example 6 | Comparative Example 6 |
|---|---|---|---|
| Ti deposition amount (g) | 0.0263 | 0.0252 | 0.0157 |
| Ag deposition amount (g) | 0.105 | 0.105 | 0.105 |
| Ti deposition amount per unit area (g/m²) | 1.003 | 0.961 | 0.599 |
| Ag deposition amount per unit area (g/m²) | 4.005 | 4.005 | 4.005 |
| bonding strength (N/mm) | 9.6 | 9.4 | 8.6 |

First, comparing the specimens of Examples 1 and 2 and Comparative Examples 1 to 4, the specimens of Examples 1 and 2 in which the deposition amount of Ag per unit area was 3.50 g/m² or more showed excellent bonding strength of 21.4 N/mm and 22.1 N/mm, respectively. On the other hand, all of the samples of Comparative Examples 1 to 4 in which the amount of deposition per unit area of Ag was less than 3.50 g/m² showed bonding strength of 7.5 N/mm or less. In particular, although the deposition amount of Ti per unit area was higher in the sample of Comparative Example 4 than the samples of Examples 1 and 2, the sample of Comparative Example 4 showed much lower bonding strength due to the smaller Ag content. This is considered to be the result of the change (improvement) of the strength of the metal sheet according to the deposition amount of Ag. Next, comparing the specimens of Examples 1 and 3 and Comparative Example 5, there is no significant difference in the deposition amount of Ti per unit area. However, the specimens of Examples 1 and 3 in which the Ag deposition amount per unit area was 6.10 g/m² or less showed excellent bonding strength of 21.4 N/mm and 16.3 N/mm, respectively. On the other hand, the adhesive force of the specimen of Comparative Example 5 was rather reduced to 15.6 N/mm. This is considered to be the result of the formation of Ag remnants on the interface due to excessive Ag deposition.

Next, when comparing the specimens of Examples 1, 2, 5, 6 and Comparative Example 6, the deposition amount of Ag per unit area is almost the same. Specimens of Examples 1, 2, 5, and 6 in which the deposition amount of Ti per unit area was 0.61 g/m² or more showed bonding strength of at least 9.4 N/mm or more. On the other hand, the specimen of Comparative Example 6 in which the deposition amount of Ti per unit area was less than 0.61 g/m² showed a low bonding strength of 8.6 N/mm or less. This is thought to be the result of the change (improvement) of the strength of the bonding layer according to the deposition amount of Ti. In particular, the specimens of Examples 1 and 2 in which the Ti deposition amount per unit area was 1.02 g/m² or more showed excellent bonding strength of 21.4 N/mm and 22.1 N/mm, respectively.

Next, examining the specimens of Examples 1, 2, and 4, all of the specimens of Examples 1, 2, and 4 in which the deposition amount of Ti per unit area was 1.30 g/m² or less showed excellent bonding strength of 20 N/mm or more. However, when the deposition amount per unit area of Ti is 1.02 g/m² or more, the bonding strength improvement range was insufficient even if the deposition amount of Ti increases, reaching the saturation value. Therefore, in order to prevent waste of raw material cost and at the same time to have optimal interfacial bonding strength, it is preferable that the deposition amount of Ti per unit area is 1.30 g/m² or less.

The invention claimed is:

1. A method of manufacturing a printed circuit board, the method comprising:
   forming (i) at least one upper deposition layer on an upper surface of each ceramic substrate included in a group of ceramic substrates and (ii) at least one lower deposition layer on a lower surface of each ceramic substrate included in the group of ceramic substrates, wherein the size of an area of the upper surface of each ceramic substrate and the size of an area of the lower surface of each ceramic substrate are the same;
   disposing the group of ceramic substrates side by side between a surface of an upper metal sheet and a surface of a lower metal sheet, wherein the size of an area of the surface of the upper metal sheet and the size of an area of the surface of the lower metal sheet are the same; and
   hot-pressing the upper and lower metal sheets to bond the upper and lower metal sheets and the group of ceramic substrates via said at least one upper deposition layer and said at least one lower deposition layer, wherein $S_B \geq P \times S_A$ where $S_A$ is the size of the area of the upper surface of each ceramic substrate, $S_B$ is the size of the area of the surface of the upper metal sheet or the lower metal sheet, and $1.5 \leq P$.

2. The method of claim 1, wherein $S_B \geq P \times S_A$ where $1.5 \leq P \leq 6.0$.

3. The method of claim 1, wherein $S_B \geq P \times S_A$ where $1.5 \leq P \leq 2.5$.

4. The method of claim 1, wherein the group of ceramic substrates is disposed between the surface of the upper metal sheet and the surface of the lower metal sheet such that $S_O \geq 0.7 \times S_T$ where $S_O$ is the size of an overlapping area overlapping the group of ceramic substrates and the upper metal sheet, and $S_T = n \times S_A$ where n is the number of ceramic substrates included in the group.

5. The method of claim 1, wherein the group of ceramic substrates is disposed between the surface of the upper metal sheet and the surface of the lower metal sheet such that $S_O \geq 0.9 \times S_T$ where $S_O$ is the size of an overlapping area overlapping the group of ceramic substrates and the upper metal sheet, and $S_T = n \times S_A$ where n is the number of ceramic substrates included in the group.

6. The method of claim 1, wherein
   each of said at least one upper deposition layer and said at least one lower deposition layer includes Ag and Ti,
   an amount of deposition of Ag per unit area is in a range of 3.50 to 6.10 g/m², and
   an amount of deposition of Ti per unit area is in a range of 0.61 to 1.30 g/m².

7. The method of claim 1, wherein the hot pressing is performed at a temperature of 450 to 1,300° C. while applying a pressure of 1 to 25 MPa.

8. The method of claim 6, wherein the amount of deposition of Ag per unit area is in a range of 4.00 to 4.60 g/m².

9. The method of claim 6, wherein the amount of deposition of Ti per unit area is in a range of 1.02 to 1.30 g/m².

10. The method of claim 5, wherein
    forming said at least one upper deposition layer on the upper surface of each ceramic substrate comprises forming a first upper deposition layer containing Ti on the upper surface of each ceramic substrate and forming a second upper deposition layer containing Ag on the first upper deposition layer, and
    forming said at least one lower deposition layer on the lower surface of each ceramic substrate comprises forming a first lower deposition layer containing Ti on the lower surface of each ceramic substrate and forming a second lower deposition layer containing Ag on the first lower deposition layer.

11. The method of claim 1, wherein each ceramic substrate included in the group includes at least one of $Si_3N_4$, AlN, or $Al_2O_3$.

12. The method of claim 11, wherein each of the upper and lower metal sheets includes at least one of Cu, Al, Ni, or Fe.

13. The method of claim 11, wherein each ceramic substrate included in the group includes at least one of $Si_3N_4$ and AlN.

14. The method of claim 12, wherein
    the hot-pressing causes a chemical reaction of a material included in the upper or lower deposition layer with a material included in each ceramic substrate included in the group,
    a bonding layer is formed by the chemical reaction,
    wherein the bonding layer includes at least TiN.

15. The method of claim 11, further comprising etching the upper and lower metal sheets and/or the group of ceramic substrates.

* * * * *